(12) United States Patent
Chen et al.

(10) Patent No.: US 11,422,204 B2
(45) Date of Patent: Aug. 23, 2022

(54) METHOD FOR DETECTING OPEN PHASE OF STARTUP/STANDBY TRANSFORMER BASED ON OPTICAL CT

(71) Applicants: NR ELECTRIC CO., LTD., Jiangsu (CN); NR ENGINEERING CO., LTD., Jiangsu (CN)

(72) Inventors: Jiasheng Chen, Jiangsu (CN); Guang Wang, Jiangsu (CN); Kai Wang, Jiangsu (CN); Yao Wang, Jiangsu (CN); Jun Chen, Jiangsu (CN); Qixue Zhang, Jiangsu (CN); Zigang Guo, Jiangsu (CN); Huazhong Li, Jiangsu (CN)

(73) Assignee: NR ELECTRIC CO., LTD, Jiangsu (CN)

(*) Notice: Subject to any disclaimer, the term of this patent is extended or adjusted under 35 U.S.C. 154(b) by 231 days.

(21) Appl. No.: 16/962,692

(22) PCT Filed: May 2, 2018

(86) PCT No.: PCT/CN2018/085323
§ 371 (c)(1),
(2) Date: Jul. 16, 2020

(87) PCT Pub. No.: WO2019/153548
PCT Pub. Date: Aug. 15, 2019

(65) Prior Publication Data
US 2020/0363479 A1 Nov. 19, 2020

(30) Foreign Application Priority Data
Feb. 11, 2018 (CN) .......................... 201810139589.1

(51) Int. Cl.
*G01R 31/62* (2020.01)
*G08B 21/02* (2006.01)
*G01R 31/54* (2020.01)

(52) U.S. Cl.
CPC .............. *G01R 31/62* (2020.01); *G01R 31/54* (2020.01); *G08B 21/02* (2013.01)

(58) Field of Classification Search
CPC ...... G01R 31/62; G01R 31/54; G01R 31/308; G01R 31/50; G08B 21/02; H02H 7/04
(Continued)

(56) References Cited

U.S. PATENT DOCUMENTS 9,714,974 B2* 7/2017 Ha .................... G01R 19/165
2016/0291063 A1* 10/2016 Blake ................... G01R 31/66
2018/0149691 A1* 5/2018 Blake ................... H02H 1/0007

FOREIGN PATENT DOCUMENTS

CN 102280853 12/2011
JP H06245367 9/1994

OTHER PUBLICATIONS

Qiao, Yongcheng et al.; "Discussion on the Open Phase Protection Scheme for Standby Transformer in Large Scale Generator Units", vol. 39, No. (17), Sep. 1, 2011, ISSN: 1674-3415, pp. 139-143.
(Continued)

*Primary Examiner* — Tung X Nguyen
*Assistant Examiner* — Robert P Alejnikov, Jr.
(74) *Attorney, Agent, or Firm* — Rankin, Hill & Clark LLP

(57) ABSTRACT

The present invention discloses a method for detecting open phase of a startup/standby transformer based on optical CT. A startup/standby transformer in a power plant is in a no-load condition for a long time as a standby power supply. Once a single-phase open phase fault occurs, there is no significant change in the voltage phasor and voltage
(Continued)

sequence component of each side. If not found in time, the defect may pose a great threat to the safe operation of the power plant. In the present invention, the optical CT is used to detect a three-phase current of the high-voltage side of the startup/standby transformer. If the current satisfies an open phase criterion, it is determined that an open phase fault occurs, and then, an alarm signal is given after a delay and an operator is informed to handle the fault in time. Therefore, the operation reliability of the startup/standby transformer system in the power plant is enhanced.

2 Claims, 2 Drawing Sheets

(58) Field of Classification Search
USPC .................................................. 324/754.23
See application file for complete search history.

(56) References Cited

OTHER PUBLICATIONS

Liu, Qing et al.; "Research on the Influence of Optical Current Transducer on Protective Relaying System", vol. 29, No. (1), Jan. 31, 2005, ISSN: 1000-367, pp. 11-14 and 29.
International Search Report filed in PCT/CN2018/085323 dated Nov. 8, 2018.

* cited by examiner

METHOD FOR DETECTING OPEN PHASE OF STARTUP/STANDBY TRANSFORMER BASED ON OPTICAL CT

TECHNICAL FIELD

The present invention relates to the field of protection and monitoring of startup/standby transformer systems in power plants, and more particularly to a method for detecting open phase of a startup/standby transformer system in a power plant.

BACKGROUND

In the power system, the open-phase operation caused by various reasons may cause the generator to be overheated or burned down, resulting in abnormality of the auxiliary power system of the power plant, which is not only a major loss to the power plant, but also a great threat to the safe operation of the power system. Therefore, how to prevent open-phase operation accidents in the power system must be taken seriously.

The World Association of Nuclear Operators (WANO) emphasized several open phase faults of the nuclear power plants and the resulting serious consequences in the experience feedback (SOER 2015-1 Safety Challenges from Open Phase Events) in 2015, hoping to attract attention in the industry and formulate corresponding safety precautions.

For example, on Jan. 30, 2012, unit No. 2 of the Byron nuclear power plant in the United States caused a high-impedance-grounded fault on the high-voltage side of the startup/standby transformer (called as "Station Auxiliary Transformer (SAT)" in the nuclear power plant) due to the drop of the lead on the porcelain insulated sleeve of the 345 kV switching station. This fault caused C-phase single-phase disconnection of two SATs. The unbalanced voltage is generated in the SAT due to the C-phase voltage loss. The reactor protection system correctly identifies the imbalance of the 6.9 kV bus voltage, and then the reactor is shut down. Moreover, several large electrical machines powered by the SAT tripped due to overcurrent of the phase current, including essential service water pumps, component cooling water pumps, etc. About eight minutes later, the abnormal voltage indication and local report found that the SAT No. 2 was smoking, and the operator of the main control room manually opened the incoming circuit breaker of the 4 kV safety-level bus in the SAT, thereby making the emergency diesel engine supply power to the 4 kV safety-level bus. This event revealed that when the open phase is caused by the equipment fault in the switching station, the protection and automatic devices do not give corresponding alarms, and the open phase is not found by the operating personnel in time, resulting in an accident of reactor shutdown and SAT damage.

Others such as unit No. 1 of Bruce A, unit No. 3 of Forsmark, and unit No. 2 of Vandellos have also experienced open phase faults of varying degrees of severity in the past few years, triggering a series of events that seriously threaten the safe operation of nuclear power plants. Moreover, the startup/standby transformer of the power plant is in a no-load state for a long time, so the current is very small, which is equivalent to 0.08% of the rated current, and thus cannot be measured by conventional electromagnetic CT. Up to now, no public report has been made on the products for detecting open phase of the startup/standby transformer of the power plant, especially the nuclear power plant.

The patent document with the application No.: CN201480017545.1 and entitled "Device for Detecting Open Phase of Connection Line of Standby Transformer in Nuclear Power Plant by Using Rogowski Coil" of Korea Hydro & Nuclear Power Co., Ltd. mentioned that the current on the Y connection line on the primary side of the standby transformer of the nuclear power plant is detected by means of the Rogowski coil to reflect the open phase fault of the standby transformer. However, this method cannot indicate the phase of the open phase fault, and there is a certain overlap with the characteristics of the single-phase ground fault of the standby transformer (in this case, the ground current also flows through the Y connection line on the primary side), the open phase fault identification is thus not unique; moreover, the measurement range and effect of the adopted Rogowski coil to the grounding zero-sequence current are not described.

SUMMARY

An objective of the present invention is to propose a method for detecting an open phase fault of a startup/standby transformer system based on optical coherence tomography (CT), which can sensitively and accurately identify the open phase fault of the startup/standby transformer system under a no-load condition, thereby improving the safety and reliability of the startup/standby transformer system operation.

The technical solution adopted by the present invention is: a method for detecting open phase of a startup/standby transformer based on optical CT, including the following steps:

step 1: using optical CT to measure a three-phase current on a high-voltage side of the startup/standby transformer;

step 2: receiving, by an open phase detection device, a current signal output by the optical CT, calculating the three-phase current on the high-voltage side of the startup/standby transformer in real time, and determining whether an open phase fault occurs according to the current; and step 3: if it is determined that an open phase fault occurs, issuing an alarm signal after a set delay or acting to trip.

Further, the selection of parameters of the optical CT is determined according to the rated voltage, current, ambient temperature, on-site installation conditions, and no-load current parameters of the startup/standby transformer.

Further, the open phase detection device directly receives the current signal output by the optical CT or receives the current signal output by the optical CT by means of a merging unit.

Further, the communication protocol complies with the IEC60044-8 standard when the open phase detection device directly receives the current signal output by the optical CT.

Further, the communication protocol complies with the IEC61850-9-2 standard when the open phase detection device receives the current signal output by the optical CT by means of the merging unit.

Further, the specific method for determining whether an open phase fault occurs in step 2 is: when the current of a certain phase is lower than a set threshold value, determining that the open phase fault occurs in the phase; and the identification formula is as follows:

$$I_p < k1 \times I_{p.0} \quad (1)$$

in formula (1), $I_p$ is the real-time calculated current of a certain phase on the high-voltage side of the startup/standby transformer, $I_{p.0}$ is a current value of the phase on the high-voltage side of the startup/standby transformer under a no-load condition, and the value can be inquired in the factory test report of the startup/standby transformer, or can be measured on site. k1 is a reliability coefficient ranging from 0.5 to 0.8, and is 0.6 by default.

Further, the specific method for determining whether an open phase fault occurs in step 2 is: when the current of a certain phase on the high-voltage side of the startup/standby transformer does not satisfy the symmetry, determining that the open phase fault occurs in the phase; the identification formulas are as follows:

$$(|I_A| < k2 \times |\dot{I}_B - \dot{I}_C|) \quad (2)$$

$$(|I_B| < k2 \times |\dot{I}_C - \dot{I}_A|) \quad (3)$$

$$(|I_C| < k2 \times |\dot{I}_A - \dot{I}_B|) \quad (4)$$

formulas (2), (3), and (4) respectively correspond to phase-A, -B, and -C disconnections, where $\dot{I}_A$, $\dot{I}_B$, and $\dot{I}_C$ are the real-time calculated fundamental phasors of the three-phase current on the high-voltage side of the startup/standby transformer. When the startup/standby transformer system is three-phase symmetrical and fault-free, the line current and the phase current satisfy the relationship of 1.732 times. Once the single-phase disconnection occurs, the line current of the sound phase is much greater than the phase current of the disconnection phase. k2 is a reliability coefficient ranging from 0.25 to 0.4, and is 0.35 by default.

Further, the set value range of the set delay in step 3 is from 0.1 s to 30.0 s, and is 10.0 s by default.

The present invention has the following advantageous effects: the small no-load current on the high-voltage side of the startup/standby transformer is detected through the application of flexible optical CT, the open phase fault is sensitively and reliably identified, and an alarm signal is issued, so that the problem of the lack of open phase fault detection function in the startup/standby transformer of the power plant is solved, thereby effectively improving the safety and reliability of the startup/standby transformer system in the power plant.

DETAILED DESCRIPTION

The present invention is further described below with reference to the accompanying drawings.

Embodiments: the present invention designs a method for detecting an open phase fault of a startup/backup transformer based on optical CT. Taking a 220 kV startup/backup transformer system of a nuclear power plant as an example, the specific implementation of the method is described.

Figure 1:
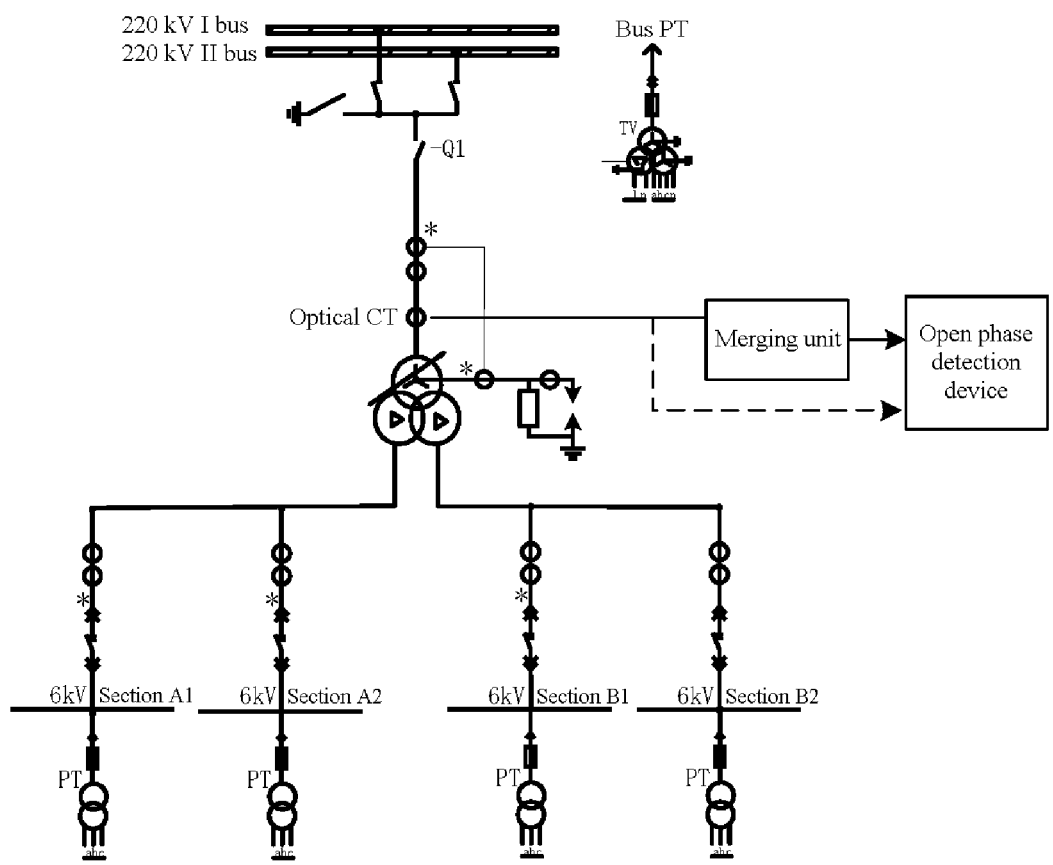
FIG. 1 is a typical application wiring diagram of the present invention.
Figure 2:
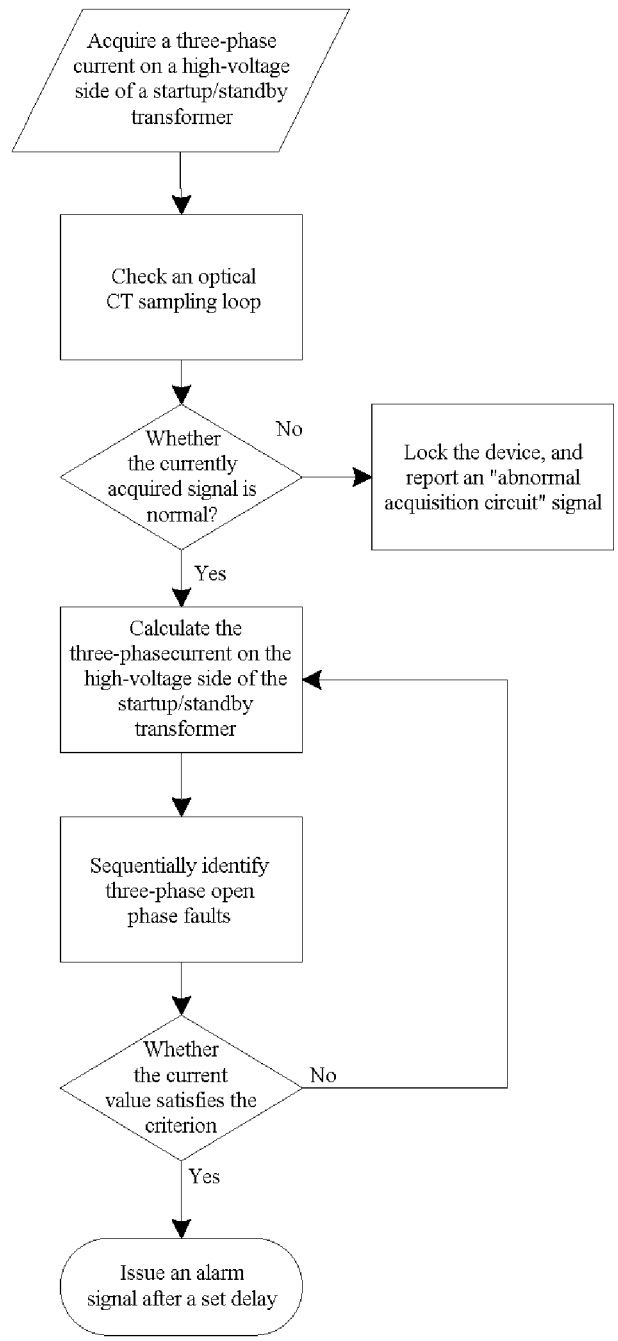
FIG. 2 is a logic diagram of open phase fault identification designed according to the present invention.

The main electrical wiring diagram and the wiring of an open phase fault detection device of the startup/standby transformer are shown in FIG. 1. The startup/standby transformer is a three-phase three-winding transformer, i.e., a Yn/D-11/D-11 wiring, the high-voltage side is a 220 kV dual-bus wiring, the low-voltage side is a split winding, and there are four 6 kV factory-use sections. The flexible optical CT is installed at the outlet of a high-voltage sleeve. The analog quantity accessed by the open phase detection device is the three-phase current on the high-voltage side (the optical CT, the communication protocol satisfies the IEC611850-9-2 or IEC60044-8 standard).

The specific steps for implementing the open phase fault detection of the high-voltage side of the startup/standby transformer of the nuclear power plant are as follows.

1. The open phase detection device calculates the phase current $I_p$ and three-phase current phasors $\dot{I}_A$, $\dot{I}_B$, and $\dot{I}_C$, of the high-voltage side of the startup/standby transformer in real time.

2. An open phase identification current set value on the high-voltage side of the startup/standby transformer is set according to the on-site measured data or the data in the factory test report of the startup/standby transformer. According to the statistics of the no-load current on the high-voltage side of the startup/standby transformer, $I_{p.0}$ is generally between 0.2 A and 0.5 A, and the value range of the reliability coefficient k1 is between 0.5 and 0.8, then the range of the open phase identification current set value is generally between 0.1 A and 0.4 A. In this example, the no-load phase current of the startup/standby transformer is 0.248 A, and the reliability factor is 0.6, then $k1 \times I_{p.0}$ is calculated as 0.149 A.

3. An optical CT acquisition loop is self-inspected, and if there is any abnormality, the device is locked, and an alarm signal is issued.

4. In the case that the optical CT acquisition loop works normally, it is proceeded to the open phase fault identification logic.

5. If the real-time calculated value of the current of a certain phase satisfies formula (1), the open phase fault alarm signal is issued after the set delay.

$$I_p < k1 \times I_{p.0} \quad (1)$$

6. If the real-time calculated value of the current of a certain phase satisfies any one of formulas (2), (3), and (4), the open phase fault alarm signal is issued after the set delay. k2 is the reliability factor, and is 0.35 by default.

$$(|I_A| < k2 \times |\dot{I}_B - \dot{I}_C|) \quad (2)$$

$$(|I_B| < k2 \times |\dot{I}_C - \dot{I}_A|) \quad (3)$$

$$(|I_C| < k2 \times |\dot{I}_A - \dot{I}_B|) \quad (4)$$

7. In order to avoid the transient interference of various faults in startup/standby transformer and adjacent systems, the delay set value is set to 10.0 s.

8. If the real-time calculated value of the current of a certain phase does not satisfy the open phase criterion, it is proceeded to the next-phase current identification, i.e., the A-, B-, C-phase cycle determination.

According to the foregoing method, the three-phase no-load current on the high-voltage side of the startup/standby transformer of the nuclear power plant is monitored in real time through the application of optical CT. When the current of a certain phase satisfies the open phase criterion, it is determined that the open phase fault occurs in the phase, and an alarm signal is issued after a set delay to remind the operator to deal with it in time.

The method can solve the problem that it is difficult to identify the single-phase disconnection fault of the high-voltage side of the startup/standby transformer under the no-load condition, improving the safety and reliability of the operation of the startup/standby transformer system of the power plant.

The above embodiments are only for explaining the technical idea of the present invention, and are not intended to limit the scope of protection of the present invention. Any equivalent replacement or modification made on the basis of the technical solution according to the technical idea proposed by the present invention shall fall within the scope of protection of the present invention.

The invention claimed is:

1. A method for detecting open phase of a startup/standby transformer based on optical coherence tomography (CT), comprising the following steps:
   step 1: using optical CT to measure a three-phase current on a high-voltage side of the startup/standby transformer;
   step 2: receiving, by an open phase detection device, a current signal output by the optical CT, calculating the three-phase current on the high-voltage side of the startup/standby transformer in real time, and determining whether an open phase fault occurs according to the current; and
   step 3: if it is determined that an open phase fault occurs, issuing an alarm signal after a set delay or acting to trip;
   wherein the specific method for determining whether an open phase fault occurs in step 2 is: when the current of a certain phase is lower than a set threshold value, determining that the open phase fault occurs in the phase; and the identification formula is as follows:

$$I_p < k1 \times I_{p.0} \tag{1}$$

in formula (1), $I_p$ is the real-time calculated fundamental amplitude of the current of a certain phase on the high-voltage side of the startup/standby transformer, $I_{p.0}$ is the fundamental amplitude of the current of the phase on the high-voltage side of the startup/standby transformer under a no-load condition, and k1 is a reliability coefficient ranging from 0.5 to 0.8.

2. A method for detecting open phase of a startup/standby transformer based on optical coherence tomography (CT), comprising the following steps:
   step 1: using optical CT to measure a three-phase current on a high-voltage side of the startup/standby transformer;
   step 2: receiving, by an open phase detection device, a current signal output by the optical CT, calculating the three-phase current on the high-voltage side of the startup/standby transformer in real time, and determining whether an open phase fault occurs according to the current; and
   step 3: if it is determined that an open phase fault occurs, issuing an alarm signal after a set delay or acting to trip;
   wherein the specific method for determining whether an open phase fault occurs in step 2 is: when the current of a certain phase on the high-voltage side of the startup/standby transformer does not satisfy the symmetry, determining that the open phase fault occurs in the phase; and the identification formulas are as follows:

$$(|I_A| < k2 \times |\dot{I}_B - \dot{I}_C|) \tag{2}$$

$$(|I_B| < k2 \times |\dot{I}_C - \dot{I}_A|) \tag{3}$$

$$(|I_C| < k2 \times |\dot{I}_A - \dot{I}_B|) \tag{4}$$

formulas (2), (3), and (4) respectively correspond to phase-A, -B, and -C disconnections, wherein $\dot{I}_A$, $\dot{I}_B$, and $\dot{I}_C$ are the real-time calculated fundamental phasors of the three-phase current on the high-voltage side of the startup/standby transformer, and k2 is a reliability coefficient ranging from 0.25 to 0.4.

* * * * *